US005929656A

United States Patent [19]

Pagones

[11] Patent Number: 5,929,656

[45] Date of Patent: Jul. 27, 1999

[54] METHOD AND APPARATUS FOR DRIVING A CAPACITIVE DISPLAY DEVICE

[75] Inventor: Andrew J. Pagones, Algonquin, Ill.

[73] Assignee: Motorola, Inc., Schaumburg, Ill.

[21] Appl. No.: 08/857,778

[22] Filed: May 16, 1997

[51] Int. Cl.[6] .................. H03K 19/0175; H03K 19/094; H03K 3/00

[52] U.S. Cl. ................................ 326/83; 326/86; 326/81; 326/68; 327/112; 327/111

[58] Field of Search ................................ 326/83, 86, 68, 326/80, 81, 17, 121; 327/111, 112, 333, 170, 215, 219

[56] References Cited

U.S. PATENT DOCUMENTS

| | | | |
|---|---|---|---|
| 4,456,909 | 6/1984 | Takahara et al. | 340/781 |
| 5,128,560 | 7/1992 | Chern et al. | 326/81 |
| 5,311,169 | 5/1994 | Inada et al. . | |
| 5,400,044 | 3/1995 | Thomas . | |
| 5,473,268 | 12/1995 | Declercq et al. . | |
| 5,739,726 | 4/1998 | Ling | 326/81 |
| 5,819,099 | 10/1998 | Ovens | 326/83 |

*Primary Examiner*—Michael Tokar
*Assistant Examiner*—Daniel D. Chang
*Attorney, Agent, or Firm*—S. Kevin Pickens; Kate Tobin

[57] ABSTRACT

An apparatus (110) for driving a capacitive display device (120) includes a pull-up transistor (180) having a source connected to a high voltage input node (184), a push-down transistor (182) having a source connected to a low voltage input node (186) and a drain connected to the drain of the pull-up transistor (180), a pull-up voltage level shifter (132) connected to the gate of the pull-up transistor (180), and a push-down voltage level shifter (134) connected to the gate of the push-down transistor (182), the drain of the pull-up transistor (180) connected to the drain of the push-down transistor (182) at a driver output node (170). A method for driving a capacitive display device (120) includes driving the capacitive display device (120) with a drive voltage signal (172) having a bandwidth substantially within the bandwidth of the capacitive display device (120).

15 Claims, 3 Drawing Sheets

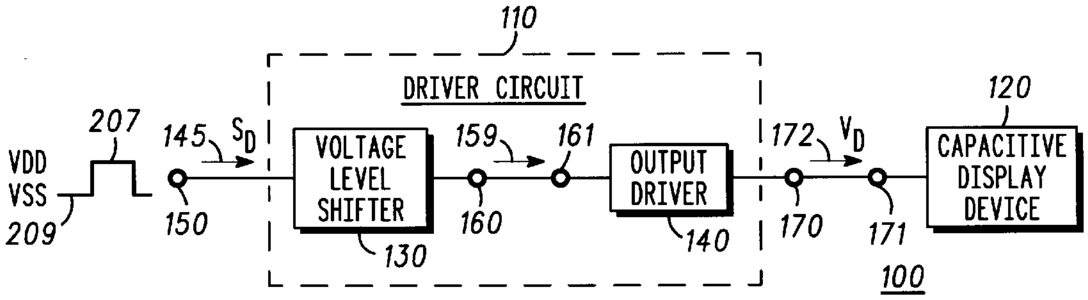
FIG. 1
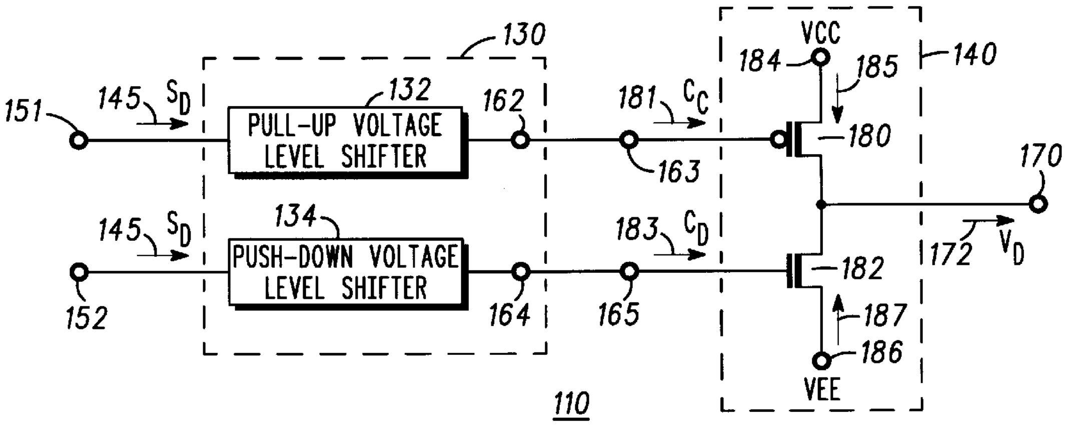
FIG. 2
FIG. 3
132
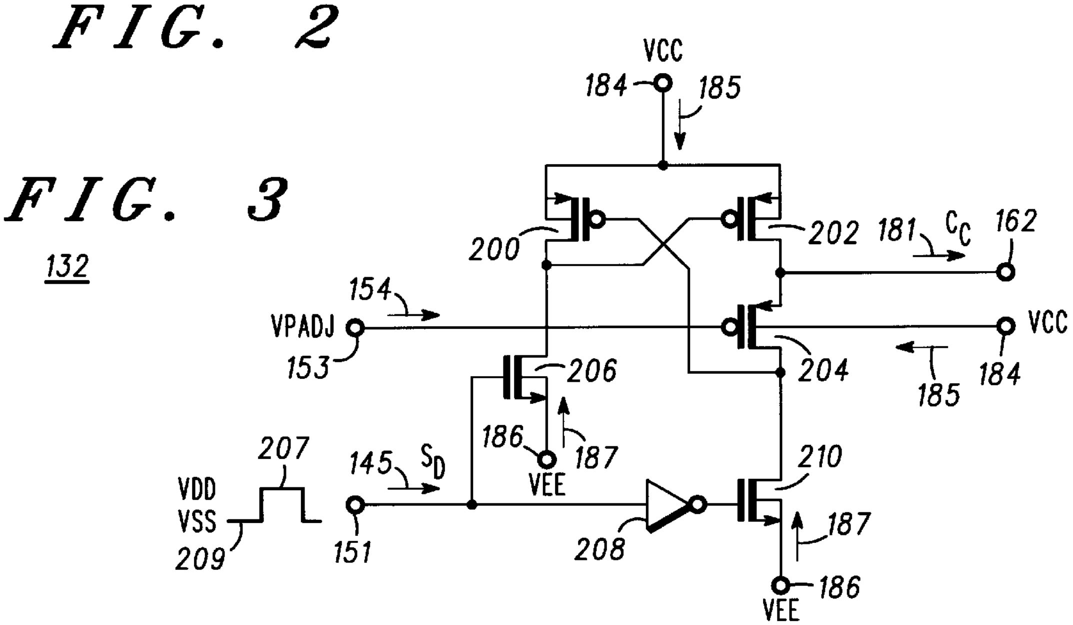

250

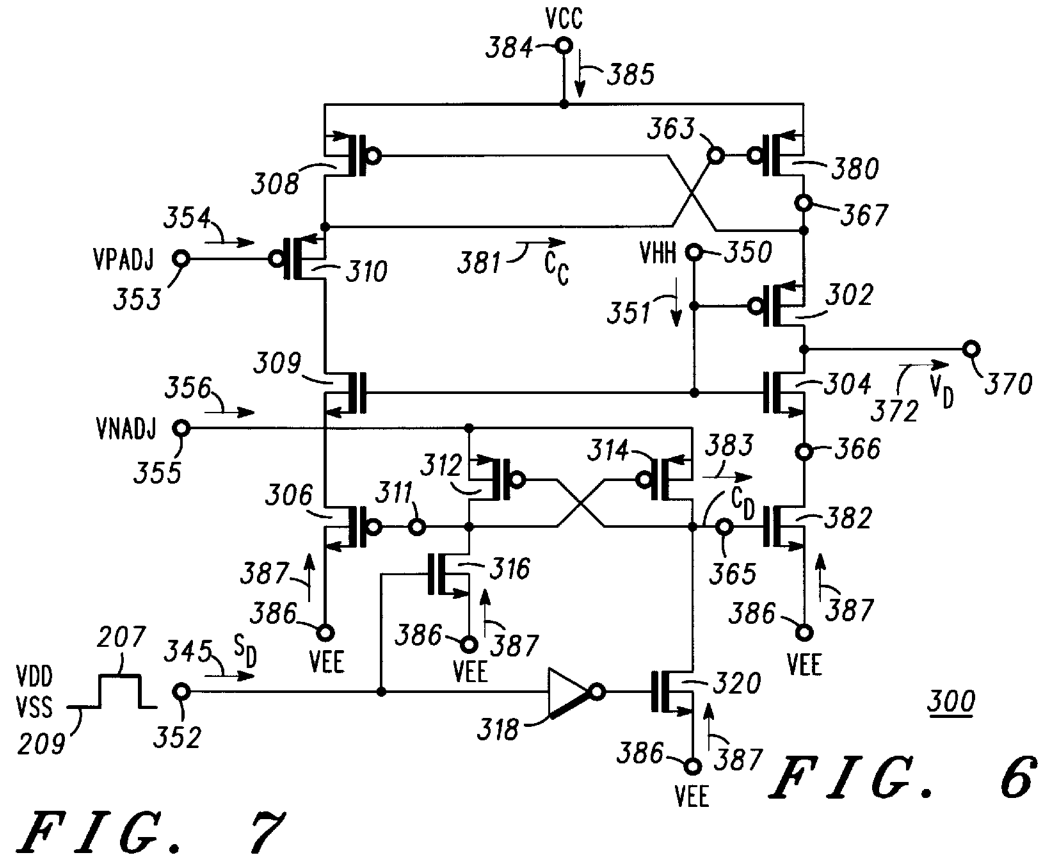
FIG. 6
FIG. 7
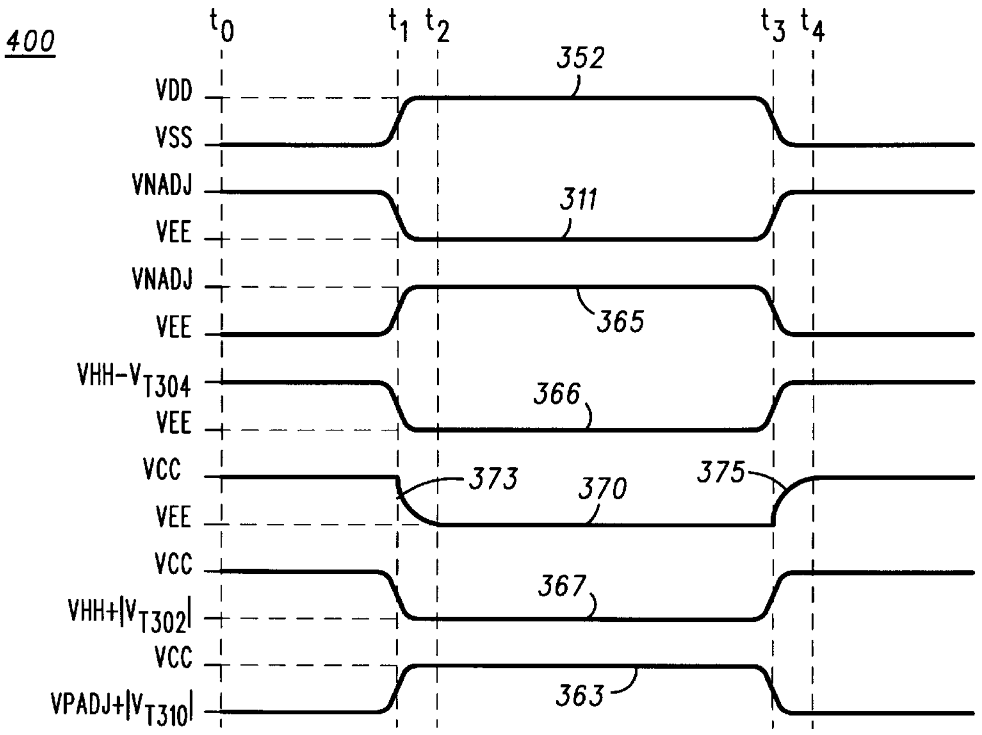

METHOD AND APPARATUS FOR DRIVING A CAPACITIVE DISPLAY DEVICE

FIELD OF THE INVENTION

The present invention pertains to the area of capacitive display devices and, more particularly, to methods for driving capacitive display devices.

BACKGROUND OF THE INVENTION

Several capacitive display devices are known in the art. These include electroluminescent displays, plasma displays, and field emission displays. Each pixel in a capacitive display device can be modeled as a capacitor, and the interconnections can be modeled as resistances. Because the display can be modeled as a distributed resistive-capacitive network, each addressed row and column has an intrinsic low-pass filter characteristic and bandwidth. Driving one end of a row or column with a signal having a bandwidth that partially lies outside the bandwidth of the device will result in that signal becoming increasingly filtered as it travels across the display. The signal at each pixel along the given row or column will differ from the inputted drive signal and from the signal at the other pixels. This signal distortion contributes to visual image distortion. The pulse at the pixels closest to the driver are sharp; the pulse at the pixels farther from the driver are slower and filtered and produce a lower intensity image. The result is a gradient in brightness across the display for a given drive signal.

One prior art scheme for correcting drive signal distortion due to signal filtering includes applying a corrective pulse width modulation (PWM) to the drive signal. This corrective PWM may be employed in addition to PWM that is responsive to grey level data. In this prior art scheme, the extent of the corrective PWM depends upon the destination of the drive signal within the matrix of the display. The corrective PWM circuitry is responsive to indications of the row and the column being addressed by the drive signal. PWM allows simple circuitry. However, PWM requires a high frequency modulation clock. This frequency increases with increasing number of grey shades and with higher display resolution. At these higher frequencies the pulse transition times from "on" to "off" and back become a significant factor in display performance. For example, the rise time and fall time of the drive signal can become greater than the active time of a pixel. This can result in no image being displayed. Furthermore, this prior art scheme has the disadvantage of requiring additional data processing to determine the corrective PWM for each pixel location.

Accordingly, there exists a need for an improved method for driving a capacitive display that allows higher resolution, provides a greater number of grey shades, is simple to implement, and reduces data processing requirements.

BRIEF DESCRIPTION OF THE DRAWINGS

FIG. 1 is a block diagram of an apparatus for driving a capacitive display device in accordance with the invention;

FIG. 2 is a block diagram of a preferred embodiment of an apparatus for driving a capacitive display device in accordance with the invention;

FIGS. 3 and 4 are a circuit diagrams of a high frequency embodiment of an apparatus for driving a capacitive display device in accordance with the invention;

FIG. 6 is a circuit diagram of a higher voltage, low frequency embodiment of an apparatus for driving a capacitive display device in accordance with the invention; and FIG. 7 is a timing diagram showing the typical operating conditions of the higher voltage, low frequency embodiment.

DESCRIPTION OF THE PREFERRED EMBODIMENTS

Figure 4:
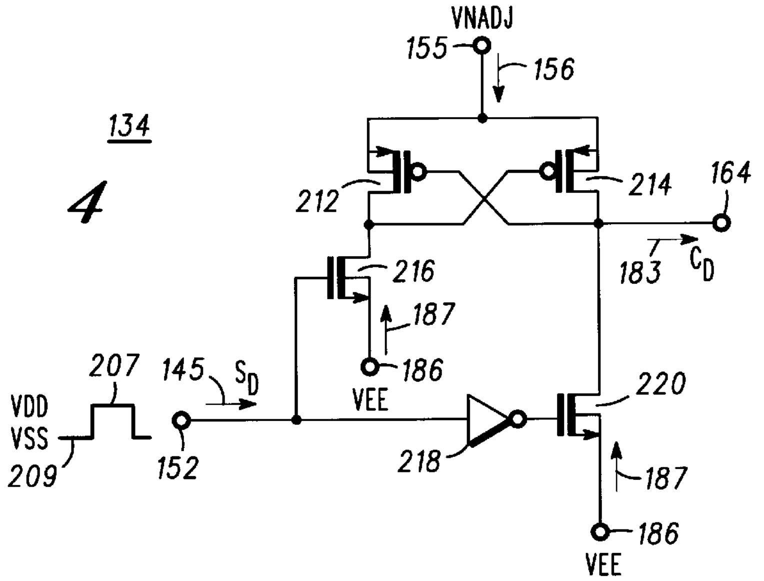

The invention is for an apparatus and method for driving a capacitive display device, which provides drive signal pulses having a bandwidth substantially within the bandwidth of the capacitive display device. The invention prevents the filtering of a drive signal as it travels across the display and provides uniform brightness over the display for a given grey level signal. The invention also reduces bandwidth-related signal distortion without requiring additional display data processing. The invention further allows adjustment of the bandwidth of the drive signal pulses. In this manner the invention can be readily adapted to many capacitive display configurations, which have varying bandwidth characteristics.

FIG. 1 is a block diagram of a capacitive display apparatus 100. Capacitive display apparatus 100 includes a capacitive display device 120 and an apparatus 110 for driving capacitive display device 120 in accordance with the invention. Apparatus 110 includes an output driver 140 and a voltage level shifter 130. Output driver 140 has an input node 161 and a driver output node 170. Voltage level shifter 130 has an input node 150 and an output node 160. Capacitive display device 120 has a display input node 171, which is connected to one of the rows or columns of capacitive display device 120. The driver circuit of apparatus 110 is provided for each row and each column of capacitive display device 120. For ease of understanding, only one driver circuit is illustrated in FIG. 1.

In the operation of capacitive display apparatus 100, an input drive voltage signal 145 ($S_D$) is applied to input node 150 of voltage level shifter 130. Input drive voltage signal 145 is provided by logic circuitry external to the circuitry of the invention and includes display data which determines parameters, such as brightness. The voltage of input drive voltage signal 145 is within a voltage range that is typical for low-voltage logic circuitry of the given process technology. Input drive voltage signal 145 includes a logic low voltage 209 (VSS), which is typically electrical ground, and a logic high voltage 207 (VDD), which is typically about 5 volts.

Input drive voltage signal 145 can include a data-write drive signal or a line-scanning drive signal. A data-write drive signal includes high-frequency pulses, the timing for which is typically generated in pulse-width modulation logic circuitry (not shown) that includes a high frequency clock. A data-write drive signal has a duration which provides a predetermined brightness or grey scale. A line-scanning drive signal includes low-frequency pulses. A pulse of the line-scanning drive signal is applied to a row or column, while the data-write drive signals are applied to the intersecting columns or rows, respectively.

Voltage level shifter 130 shifts input drive voltage signal 145 to provide a driver control signal 159 at output node 160. Driver control signal 159 includes a voltage within a second range of voltages, which is useful for controlling output driver 140 to realize a predetermined drive current to capacitive display device 120. Output node 160 of voltage level shifter 130 is connected to input node 161 of output driver 140. Driver control signal 159 controls output driver 140, so that a predetermined drive voltage signal is realized at driver output node 170. Driver output node 170 is connected to display input node 171 for applying a drive voltage signal 172 ($V_D$) thereto.

In general, driver control signal 159 is predetermined to realize drive voltage signal 172 having a bandwidth that lies substantially within the bandwidth of capacitive display device 120. The bandwidth of capacitive display device 120 includes those frequencies that remain substantially unfiltered when they are applied across a row or column of capacitive display device 120. A substantially unfiltered signal, in the context of the invention, is one that is not filtered or is filtered to a minimal extent when it is applied over the length of a row or column of capacitive display device 120. The extent of signal filtering is limited so that the spatial variation in brightness for a given signal is within predetermined limits that provide a display image having acceptable quality. A given drive voltage signal 172 results in substantially the same waveform at each pixel along the row or column and, therefore, produces substantially the same brightness at any "on" pixel. In this manner brightness uniformity is realized.

FIG. 2 is a block diagram of a preferred embodiment of apparatus 110 in accordance with the invention. In the embodiment of FIG. 2, output driver 140 includes a pull-up transistor 180 and a push-down transistor 182. A high voltage input node 184 is connected to the source of pull-up transistor 180. A first voltage 185 (VCC) is applied at high voltage input node 184. First voltage 185 has a magnitude that exceeds the magnitude of logic high voltage 207.

A low voltage input node 186 is connected to the source of push-down transistor 182. A second voltage 187 (VEE) is applied at low voltage input node 186. Second voltage 187 has a magnitude that is lower than the magnitude of first voltage 185 and can be at electrical ground. The drain of push-down transistor 182 is connected to the drain of pull-up transistor 180 at driver output node 170 for providing drive voltage signal 172. A first input node 163 of output driver 140 is connected to the gate of pull-up transistor 180, and a second input node 165 of output driver 140 is connected to the gate of push-down transistor 182.

In the embodiment of FIG. 2, voltage level shifter 130 includes a pull-up voltage level shifter 132, which has a first input node 151 and an output node 162. Voltage level shifter 130 further includes a push-down voltage level shifter 134, which has a first input node 152 and an output node 164. Output node 162 of pull-up voltage level shifter 132 is connected to first input node 163 of output driver 140 for providing a charging control voltage 181 ($C_C$) to the gate of pull-up transistor 180. Output node 164 of push-down voltage level shifter 134 is connected to second input node 165 of output driver 140 for providing a discharging control voltage 183 ($C_D$) to the gate of push-down transistor 182.

In the operation of the embodiment of FIG. 2, input drive voltage signal 145 is applied at first input nodes 151, 152. The circuitry of pull-up voltage level shifter 132 is responsive to input drive voltage signal 145 and provides an output voltage that is within a range useful for controlling pull-up transistor 180. Charging control voltage 181 is predetermined to control the current through pull-up transistor 180.

The circuitry of push-down voltage level shifter 134 is also responsive to input drive voltage signal 145 and provides an output voltage that is within a range useful for controlling push-down transistor 182. Discharging control voltage 183 is predetermined to control the current through push-down transistor 182.

By controlling the current through pull-up transistor 180 and push-down transistor 182, the output current of output driver 140 is controlled. This output current is applied to capacitive display device 120, which is a capacitive load. Pull-up transistor 180 includes a means for charging the capacitive load and thereby increase drive voltage signal 172; push-down transistor 182 includes a means for discharging the capacitive load and thereby decrease drive voltage signal 172.

The rate of change of drive voltage signal 172 determines the bandwidth of drive voltage signal 172. Thus, the rate of change of drive voltage signal 172 is predetermined and controlled to provide a bandwidth of drive voltage signal 172 that is substantially within the bandwidth of capacitive display device 120. Transitions in drive voltage signal 172 occur during the charging and discharging of capacitive display device 120. The rates of change of drive voltage signal 172 during the charging and discharging transitions are controlled by controlling the charging and discharging currents, respectively, at the output of output driver 140.

FIGS. 3 and 4 schematically illustrate the circuitry of pull-up voltage level shifter 132 and push-down voltage level shifter 134, respectively, for a high frequency embodiment of the invention. The embodiment of FIGS. 3 and 4 is useful for input drive voltage signals 145 that have high frequencies within a range of about 0–50 MHz. In general this range will depend upon the process technology. For example, the embodiment of FIGS. 3 and 4 is useful when input drive voltage signal 145 includes a data-write drive signal.

As illustrated in FIG. 3, pull-up voltage level shifter 132 includes a first high voltage transistor 200 and a second high voltage transistor 202. The source and substrate of each of high voltage transistors 200, 202 is connected to high voltage input node 184. The gate of second high voltage transistor 202 is connected to the drain of first high voltage transistor 200.

Pull-up voltage level shifter 132 further includes a voltage limiting transistor 204. The source of voltage limiting transistor 204 is connected to the drain of second high voltage transistor 202; the substrate of voltage limiting transistor 204 is connected to high voltage input node 184; the drain of voltage limiting transistor 204 is connected to the gate of first high voltage transistor 200; and the gate of voltage limiting transistor 204 is connected to a second input node 153 of pull-up voltage level shifter 132. Second input node 153 receives a first adjustable voltage 154 (VPADJ), which determines the lower limit of the voltage swing at output node 162 of pull-up voltage level shifter 132.

Pull-up voltage level shifter 132 further includes a first interface transistor 206. The drain of first interface transistor 206 is connected to the drain of first high voltage transistor 200; the source and the substrate of first interface transistor 206 is connected to low voltage input node 186; the gate of first interface transistor 206 is connected to first input node 151 of pull-up voltage level shifter 132.

Pull-up voltage level shifter 132 also includes a second interface transistor 210 and an inverter 208. The drain of second interface transistor 210 is connected to the drain of voltage limiting transistor 204; the source and the substrate of second interface transistor 210 is connected to low voltage input node 186. The input of inverter 208 is connected to first input node 151 of pull-up voltage level shifter 132, and the output of inverter 208 is connected to the gate of second interface transistor 210.

Illustrated in FIG. 4 is a circuit diagram of push-down voltage level shifter 134 of the high frequency embodiment of the invention. Push-down voltage level shifter 134 includes a first high voltage transistor 212 and a second high voltage transistor 214. The gate of second high voltage transistor 214 is connected to the drain of first high voltage transistor 212. The source and the substrate of each of high voltage transistors 212, 214 are connected to a second input node 155 of push-down voltage level shifter 134. Second input node 155 receives a second adjustable voltage 156 (VNADJ), which determines the upper limit of the voltage swing at output node 164 of push-down voltage level shifter 134. Second adjustable voltage 156 is provided by external circuitry not shown.

Push-down voltage level shifter 134 further includes a first interface transistor 216 and a second interface transistor 220. The drain of first interface transistor 216 is connected to the drain of first high voltage transistor 212; the source and the substrate of first interface transistor 216 are connected to low voltage input node 186; and the gate of first interface transistor 216 is connected to first input node 152 of push-down voltage level shifter 134. The drain of second interface transistor 220 is coupled to the drain of second high voltage transistor 214 and to the gate of first high voltage transistor 212 at output node 164 of push-down voltage level shifter 134; the source and the substrate of second interface transistor 220 are connected to low voltage input node 186.

Push-down voltage level shifter 134 also includes an inverter 218. The input of inverter 218 is connected to first input node 152 of push-down voltage level shifter 134, and the output of inverter 218 is connected to the gate of second interface transistor 220.

First and second interface transistors 206, 210 of pull-up voltage level shifter 132 and first and second interface transistors 216, 220 of push-down voltage level shifter 134 include low-to-high voltage, interface transistors. These devices have regions of thinner gate oxides, which are not included in the high voltage transistors of the circuit. The gate-to-source voltages for these devices have an upper limit approximately equal to logic high voltage 207. When this upper limit is provided by common logic circuitry, it is typically 5 volts. The drain terminal structure of these devices contains a region of thick gate oxide that allows the drain to withstand the application of voltages greater than logic high voltage 207. Thus, the drains of these interface transistors can tolerate voltages above logic high voltage 207 with respect to the gate, the source, and the substrate. The remaining high voltage transistors of the circuit of the invention have thicker gate oxides to protect against oxide failure from the large electric fields produced by the higher voltage biases.

Figure 5:
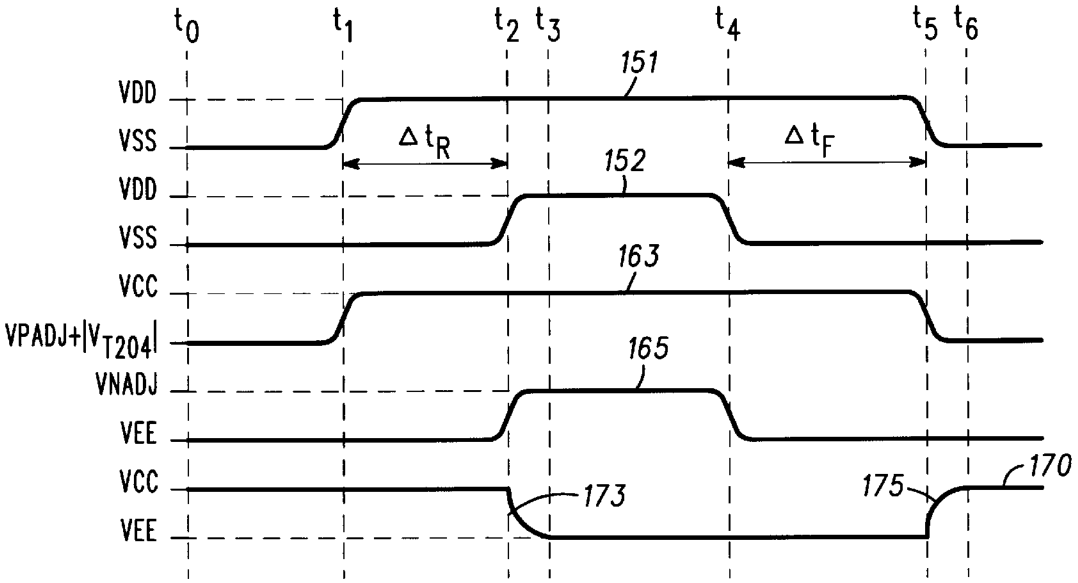
FIG. 5 is a timing diagram showing typical operating conditions of the high frequency embodiment.

FIG. 5 illustrates a timing diagram 250 showing voltage responses at selected nodes during the operation of the high frequency embodiment of FIGS. 3 and 4. By providing two distinct level shift circuits, the timing of input drive voltage signal 145 at first input nodes 151, 152 can be controlled independently. In order to reduce power loss caused by the simultaneous conduction of pull-up transistor 180 and push-down transistor 182, delays $\Delta t_R$ and $\Delta t_F$ are provided between the rising edges and the falling edges, respectively, of input drive voltage signal 145 at first input nodes 151, 152. In this manner a "break-before-make" switch is employed. Delays $\Delta t_R$ and $\Delta t_F$ may, for example, each be made equal to one period of the pulse-width modulation clock. Other ways of implementing the delays will occur to one skilled in the art.

As indicated in FIG. 5, at to, first input nodes 51, 152 are at logic low voltage 209 (VSS); first input node 163 of output driver 140, which is connected to the gate of pull-up transistor 180, is at a voltage equal to the sum of first adjustable voltage VPADJ and $|V_{T204}|$, which is the magnitude of the threshold voltage of voltage limiting transistor 204; second input node 165 of output driver 140, which is connected to the gate of push-down transistor 182, is at second voltage 187 (VEE); and driver output node 170 is at first voltage 185 (VCC).

At time $t_1$, logic high voltage 207 (VDD) is applied to first input node 151 of pull-up voltage level shifter 132. This causes pull-up voltage level shifter 132 to pull the voltage at first input node 163 of output driver 140 to first voltage 185 (VCC), so that pull-up transistor 180 is turned off and does not conduct.

After delay time $\Delta t_R$, at time $t_2$, logic high voltage 207 (VDD) is applied to first input node 152 of push-down voltage level shifter 134. This causes push-down voltage level shifter 134 to pull the voltage at second input node 165 of output driver 140 to second adjustable voltage VNADJ. This causes push-down transistor 182 to be turned on and conduct. In this manner a discharging current is realized from capacitive display device 120, and a first drive voltage response 173 is realized at driver output node 170, so that drive voltage signal 172 is pulled down to second voltage 187.

The rate of change of drive voltage signal 172 between times $t_2$ and $t_3$ depends upon the current through push-down transistor 182, which in turn depends upon the gate-to-source potential of push-down transistor 182. For a fixed second voltage 187, the gate-to-source potential depends on the value of discharging control voltage 183, which can be changed by adjusting the value of second adjustable voltage 156 (VNADJ). The highest rate of change of first drive voltage response 173 determines the extent of the bandwidth of drive voltage signal 172. In accordance with the invention, the rate of change of first drive voltage response 173 is controlled to provide a bandwidth of drive voltage signal 172 that is substantially within the bandwidth of capacitive display device 120.

Between times $t_3$ and $t_5$ drive voltage signal 172 is provided to effect pixel illumination at the pixel that is being addressed. The duration of this pulse depends upon the display data which determines brightness.

Thus, push-down transistor 182 functions as a discharging means for discharging capacitive display device 120. Push-down voltage level shifter 134 functions as a discharge activation means, which is responsive to logic high voltage 207 of input drive voltage signal 145, for activating the discharging means to realize a predetermined discharging current from capacitive display device 120.

At time $t_4$, the voltage at first input node 152 of push-down voltage level shifter 134 is switched to second voltage 187 (VEE). This causes push-down voltage level shifter 134 to pull down discharging control voltage 183 at second input node 165 to second voltage 187 (VEE), so that push-down transistor 182 is turned off and no longer conducts.

At time $t_5$, the voltage at first input node 151 of pull-up voltage level shifter 132 is switched to logic low voltage 209 (VSS). This causes pull-up voltage level shifter 132 to reduce charging control voltage 181 to the sum of VPADJ and $|V_{T204}|$. This turns on pull-up transistor 180. In this manner a charging current is provided to capacitive display device 120, and a second drive voltage response 175 is realized at driver output node 170. The charging current charges the capacitive load between times $t_5$ and $t_6$, so that drive voltage signal 172 at driver output node 170 is pulled back up to first voltage 185 (VCC).

The rate of change of drive voltage signal 172 between times $t_5$ and $t_6$ depends upon the current through pull-up transistor 180, which in turn depends upon the gate-to-source potential of pull-up transistor 180. For a fixed first voltage 185, the gate-to-source potential depends on the value of charging control voltage 181, which can be changed by adjusting the value of first adjustable voltage 154 (VPADJ). The highest rate of change of second drive voltage response 175 determines the extent of the bandwidth of drive voltage signal 172. In accordance with the invention, the rate of change of second drive voltage response 175 is controlled to provide a bandwidth of drive voltage signal 172 that is substantially within the bandwidth of capacitive display device 120. After time $t_6$ drive voltage signal 172 is provided to prevent pixel illumination.

Thus, pull-up transistor 180 functions as a charging means for charging capacitive display device 120. Pull-up voltage level shifter 132 functions as a charge activation means, which is responsive to logic low voltage 209 of input drive voltage signal 145, for activating the charging means to realize a predetermined charging current to capacitive display device 120.

A particular capacitive display device configuration is driven by the circuit and method of the invention by adjusting and optimizing the values of first and second adjustable voltages 154, 156 (VPADJ and VNADJ) to realize rates of change of drive voltage signal 172 that result in a bandwidth of drive voltage signal 172 that is substantially within the bandwidth of that particular capacitive display device configuration. It will be appreciated that these adjustments are static, persistent, and, therefore, low in energy consumption, unlike the dynamic adjustments of the prior art.

A benefit of the high frequency embodiment of FIGS. 2–5 is that pull-up voltage level shifter 132 is independent of push-down voltage level shifter 134. This allows independent control of pull-up transistor 180 and push-down transistor 182, so that they do not conduct simultaneously at any time during the operation of apparatus 110. Without delays between the inputs, a momentary conductive path exists from supply VCC to ground VEE. This "crowbar" current is eliminated in the method described with reference to FIG. 5. A crowbar current can otherwise be a significant source of power dissipation. However, if desired, the method of the invention can be implemented without including the delays between the inputs. It will be further appreciated that, while the embodiment of FIGS. 2–5 is preferred for the processing of high frequency input signals, this embodiment is also useful for driving a capacitive display device with low frequency input signals.

FIG. 6 is a circuit diagram of a higher voltage, low frequency embodiment of an apparatus 300 for driving capacitive display device 120 in accordance with the invention. The embodiment of FIG. 6 is useful for driving capacitive display device 120 using an input drive voltage signal 345 ($S_D$), which includes a low frequency signal, such as a line-scanning drive signal. The drive voltage signal provided by the embodiment of FIG. 6 swings through a voltage range having a maximum voltage that exceeds the maximum device voltage.

Apparatus 300 includes a high voltage input node 384 for receiving a first voltage 385 (VCC) and a low voltage input node 386 for receiving a second voltage 387 (VEE). Second voltage 387 is lower than first voltage 385 and can be equal to electrical ground. Apparatus 300 further includes a pull-up transistor 380 and a push-down transistor 382. The source and the substrate of pull-up transistor 380 are connected to high voltage input node 384, and the source and the substrate of push-down transistor 382 are connected to low voltage input node 386.

Apparatus 300 further includes a first output buffer transistor 302 and a second output buffer transistor 304. The source and the substrate of first output buffer transistor 302 are connected to the drain of pull-up transistor 380. The source and the substrate of second output buffer transistor 304 are connected to the drain of push-down transistor 382. The drain of first output buffer transistor 302 and the drain of second output buffer transistor 304 are coupled at a driver output node 370 for transmitting a drive voltage signal 372 ($V_D$) thereto. Driver output node 370 is designed to be connected to display input node 171 of capacitive display device 120.

Apparatus 300 also includes a first level shift driver 308 and a second level shift driver 306. The source and the substrate of first level shift driver 308 are connected to high voltage input node 384. The gate of first level shift driver 308 is connected to the drain of pull-up transistor 380. The source and the substrate of second level shift driver 306 are connected to low voltage input node 386.

Apparatus 300 further includes a swing-limiting buffer device 310 and a first input node 353, which is connected to the gate of swing-limiting buffer device 310 and receives a first adjustable voltage 354 (VPADJ). First adjustable voltage 354 is provided by a voltage source (not shown). The source and the substrate of swing-limiting buffer device 310 and the drain of first level shift driver 308 are coupled to the gate of pull-up transistor 380 for transmitting a charging control voltage 381 ($C_C$) thereto.

Apparatus 300 also includes a buffer transistor 309. The drain of buffer transistor 309 is connected to the drain of swing-limiting buffer device 310, and the source and the substrate of buffer transistor 309 are connected to the drain of second level shift driver 306.

A second input node 355 is provided for receiving a second adjustable voltage 356 (VNADJ). The source and the substrate of a first high voltage transistor 312 are connected to second input node 355. The source and the substrate of a second high voltage transistor 314 are also connected to second input node 355.

A third input node 352 is provided for receiving input drive voltage signal 345. Input drive voltage signal 345 is provided by logic circuitry external to the circuitry of the invention. Input drive voltage signal 345 typically includes a logic signal that is switched between logic low voltage 209 (VSS), which is typically electrical ground, and logic high voltage 207 (VDD), which is typically about 5 volts.

Apparatus 300 further includes a first interface transistor 316, a second interface transistor 320, and an inverter 318. The source and the substrate of first interface transistor 316 are connected to low voltage input node 386. The gate of first interface transistor 316 is connected to third input node 352. The drain of first interface transistor 316, the gate of second high voltage transistor 314, and the drain of first high voltage transistor 312 are connected to the gate of second level shift driver 306. The source and the substrate of second interface transistor 320 are connected to low voltage input node 386. The drain of second interface transistor 320, the drain of second high voltage transistor 314, and the gate of first high voltage transistor 312 are connected to the gate of push-down transistor 382 for transmitting a discharging control voltage 383 ($C_D$) thereto. The input of inverter 318 is connected to third input node 352, and the output of inverter 318 is connected to the gate of second interface transistor 320. Inverter 318 is constructed with normal, 5 volt CMOS logic.

Also included in apparatus 300 is a fourth input node 350 for receiving an intermediate voltage 351 (VHH). The gate of first output buffer transistor 302, the gate of second output buffer transistor 304, and the gate of buffer transistor 309 are coupled to fourth input node 350. Intermediate voltage 351 is equal to about half of first voltage 385 (VCC). By biasing the inner devices of apparatus 300 at about half the value of first voltage 385, the circuit of the present embodiment ensures that the maximum voltage across any two device terminals is not greater than its limit, which is equal to about half the value of first voltage 385. Thus, apparatus 300 is capable of operating at voltages above the maximum voltage recommended for the integrated circuit process.

First interface transistor 316 and second interface transistor 320 include low-to-high voltage, interface transistors, which are described in greater detail with reference to FIG. 4. These devices are useful for low voltage gate signals and high voltage drain signals. The remaining transistors of apparatus 300 include high voltage transistors having thick gate oxides.

In the operation of the embodiment of FIG. 6, first adjustable voltage 354 (VPADJ) is applied through swing limiting buffer device 310 to the gate of pull-up transistor 380 and is used to control the pull-up rate of drive voltage signal 372. Second adjustable voltage 356 (VNADJ) can be switched by the N-driver level shift circuitry directly onto the gate of push-down transistor 382 and is used to control the push-down transition rate of drive voltage signal 372.

FIG. 7 illustrates a timing diagram 400 showing voltage responses at selected nodes during the operation of the higher voltage, low frequency embodiment of FIG. 6. At time $t_0$, third input node 352 is at logic low voltage 209 (VSS); a first node 311, which is connected to the gate of second level shift driver 306, is at second adjustable voltage 356 (VNADJ); a second node 365, which is connected to the gate of push-down transistor 382, is at second voltage 387 (VEE); a third node 366, which is connected to the drain of push-down transistor 382, is at a voltage equal to intermediate voltage 351 minus the threshold voltage of second output buffer transistor 304 ($V_{T304}$); driver output node 370 is at first voltage 385; a fourth node 367, which is connected to the drain of pull-up transistor 380, is also at first voltage 385; and a fifth node 363, which is connected to the gate of pull-up transistor 380, is at a voltage equal to the sum of first adjustable voltage 354 (VPADJ) and the magnitude of the threshold voltage of swing-limiting buffer device 310.

At time $t_1$, input drive voltage signal 345 is switched by external logic circuitry to logic high voltage 207 (VDD). This causes the voltage at first node 311 to drop to second voltage 387 (VEE) and turn off second level shift driver 306, and the N-driver level shift circuitry pulls up discharging control voltage 383 at second node 365 to second adjustable voltage 356 (VNADJ). The voltage at third node 366 drops to second voltage 387. This turns on second output buffer transistor 304 and allows fourth node 367 to drop due to the greater current drive of push-down transistor 382 compared to the current drive of pull-up transistor 380.

The dropping voltage at fourth node 367 causes first level shift driver 308 to turn on and pull charging control voltage 381 up to first voltage 385, turning off pull-up transistor 380. This allows the voltage at fourth node 367 to drop to the sum of intermediate voltage 351 and the magnitude of the threshold voltage of first output buffer transistor 302 ($|V_{T302}|$).

These conditions result in a discharging current and a first drive voltage response 373 at driver output node 370. The rate of change of drive voltage signal 372 between times $t_1$, and $t_2$ is controlled by adjusting the value of second adjustable voltage 356, such that drive voltage signal 372 is provided having a bandwidth substantially within the bandwidth of capacitive display device 120.

Between times $t_2$ and $t_3$ drive voltage signal 372 is provided to effect pixel illumination at the pixels that are being addressed. The duration of this pulse equals the display line time for an address select signal.

At time $t_3$, input drive voltage signal 345 is switched by external logic circuitry to logic low voltage 209 (VSS). This causes the voltage at first node 311 to be pushed up to second adjustable voltage 356 and turn on second level shift driver 306, and the N-driver level shift circuitry pushes down discharging control voltage 383 at second node 365 to second voltage 387. This turns off push-down transistor 382, and causes the voltage at third node 366 to rise to the difference between intermediate voltage 351 and the threshold voltage of second output buffer transistor 304.

The switching down of input drive voltage signal 345 also causes charging control voltage 381 at fifth node 363 to be pushed down to the sum of first adjustable voltage 354 and the magnitude of the threshold voltage of swing-limiting buffer device 310 ($|V_{T310}|$). This turns on pull-up transistor 380. The voltage at fourth node 367 is also pulled up to first voltage 385. After time $t_4$ drive voltage signal 372 is provided to prevent pixel illumination.

These conditions result in a charging current and a second drive voltage response 375 at driver output node 370. The rate of change of drive voltage signal 372 between times $t_3$ and $t_4$ is controlled by adjusting the value of first adjustable voltage 354, such that drive voltage signal 372 is provided having a bandwidth substantially within the bandwidth of capacitive display device 120. It is desired to be understood that signal polarities may be reversed to adapt the circuit of the invention to the requirements of a particular capacitive display device for the line-scanning signals or the intensity data signals.

In summary, an apparatus and method for driving a capacitive display device in accordance with the invention includes circuitry for controlling the rates of change of a drive voltage signal, so that the bandwidth of the drive voltage signal is substantially within the bandwidth of the capacitive display device. This allows the drive voltage signal to remain substantially unfiltered and retain its waveform as it crosses the display. Uniform brightness is thereby achieved. A further benefit of reducing the rate of change of the drive voltage is a reduction in the peak capacitive charging current. Thus, the method of the invention reduces power and current requirements.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

I claim:

1. A method for driving a capacitive display device having a bandwidth, the method comprising the steps of:

providing an input drive voltage signal having a voltage within a first voltage range;

shifting the input drive voltage signal to provide a driver control signal having a voltage within a second voltage range; and controlling a drive current to the capacitive display device with the driver control signal to realize a drive voltage signal having a bandwidth substantially within the bandwidth of the capacitive display device.

2. An apparatus for driving a capacitive display device having a display input node, the apparatus comprising:

charging means connected to the display input node of the capacitive display device for charging the capacitive display device;

discharging means connected to the display input node of the capacitive display device for discharging the capacitive display device;

discharge activation means responsive to a first voltage of an input drive voltage signal and connected to the discharging means for activating the discharging means to realize a predetermined discharging current from the capacitive display device, the predetermined discharging current providing a first drive voltage response at the display input node of the capacitive display device, the first drive voltage response having a bandwidth substantially within the bandwidth of the capacitive display device; and charge activation means responsive to a second voltage of the input drive voltage signal and connected to the charging means for activating the charging means to realize a predetermined charging current to the capacitive display device, the predetermined charging current providing a second drive voltage response at the display input node of the capacitive display device, the second drive voltage response having a bandwidth substantially within the bandwidth of the capacitive display device.

3. The apparatus for driving a capacitive display device as claimed in claim 2, wherein the discharge activation means has an input node for receiving an adjustable voltage to control the predetermined discharging current.

4. The apparatus for driving a capacitive display device as claimed in claim 2, wherein the charge activation means has an input node for receiving an adjustable voltage to control the predetermined charging current.

5. An apparatus for driving a capacitive display device, the apparatus comprising:

a high voltage input node for receiving a first voltage;

a low voltage input node for receiving a second voltage;

a pull-up transistor having a gate, a source, and a drain, the source of the pull-up transistor connected to the high voltage input node;

a push-down transistor having a gate, a source, and a drain, the drain of the push-down transistor connected to the drain of the pull-up transistor, the source of the push-down transistor connected to the low voltage input node;

the drain of the pull-up transistor and the drain of the push-down transistor coupled at a driver output node;

a pull-up voltage level shifter having a first input node for receiving an input drive voltage signal, a second input node for receiving a first adjustable voltage and an output node connected to the gate of the pull-up transistor for transmitting a charging control voltage thereto; and a push-down voltage level shifter having a first input node for receiving the input drive voltage signal, a second input node for receiving a second adjustable voltage and an output node connected to the gate of the push-down transistor for transmitting a discharging control voltage thereto;

whereby the pull-up voltage level shifter provides a charging control voltage at the gate of the pull-up transistor within a range defined by the first voltage and the first adjustable voltage, and the push-down voltage level shifter provides a discharging control voltage at the gate of the push-down transistor within a range defined by the second adjustable voltage and the second voltage.

6. The apparatus claimed in claim 5, wherein the pull-up voltage level shifter comprises:

a first high voltage transistor having a gate, a drain, a source, and a substrate, the source and the substrate of the first high voltage transistor connected to the high voltage input node;

a second high voltage transistor having a gate, a drain, a source, and a substrate, the source and the substrate of the second high voltage transistor connected to the high voltage input node, the gate of the second high voltage transistor connected to the drain of the first high voltage transistor;

a voltage limiting transistor having a gate, a drain, a source, and a substrate, the source of the voltage limiting transistor connected to the drain of the second high voltage transistor, the substrate of the voltage limiting transistor connected to the high voltage input node, the drain of the voltage limiting transistor connected to the gate of the first high voltage transistor, the gate of the voltage limiting transistor connected to the second input node of the pull-up voltage level shifter;

a first interface transistor having a gate, a drain, a source, and a substrate, the drain of the first interface transistor connected to the drain of the first high voltage transistor, the source and the substrate of the first interface transistor connected to the low voltage input node, the gate of the first interface transistor connected to the first input node of the pull-up voltage level shifter;

a second interface transistor having a gate, a drain, a source, and a substrate, the drain of the second interface transistor connected to the drain of the voltage limiting transistor, the source and the substrate of the second interface transistor connected to the low voltage input node; and an inverter having an input and an output, the input of the inverter connected to the first input node of the pull-up voltage level shifter, the output of the inverter connected to the gate of the second interface transistor.

7. The apparatus claimed in claim 5, wherein the push-down voltage level shifter comprises:

a first high voltage transistor having a gate, a drain, a source, and a substrate, the source and the substrate of the first high voltage transistor connected to the second input node of the push-down voltage level shifter;

a second high voltage transistor having a gate, a drain, a source, and a substrate, the source and the substrate of the second high voltage transistor connected to the second input node of the push-down voltage level shifter, the gate of the second high voltage transistor connected to the drain of the first high voltage transistor;

a first interface transistor having a gate, a drain, a source, and a substrate, the drain of the first interface transistor connected to the drain of the first high voltage transistor, the source and the substrate of the first interface transistor connected to the low voltage input node, the gate of the first interface transistor connected to the first input node of the push-down voltage level shifter;

a second interface transistor having a gate, a drain, a source, and a substrate, the drain of the second interface transistor coupled to the drain of the second high voltage transistor and the gate of the first high voltage transistor at the output node of the push-down voltage level shifter, the source and the substrate of the second interface transistor connected to the low voltage input node; and an inverter having an input and an output, the input of the inverter connected to the first input node of the push-down voltage level shifter, the output of the inverter connected to the gate of the second interface transistor.

8. An apparatus for driving a capacitive display device, the apparatus comprising:

a high voltage input node for receiving a first voltage;

a low voltage input node for receiving a second voltage;

a pull-up transistor having a gate, a drain, a source, and a substrate, the source and the substrate of the pull-up transistor connected to the high voltage input node;

a push-down transistor having a gate, a drain, a source, and a substrate, the source and the substrate of the push-down transistor connected to the low voltage input node;

a first output buffer transistor having a gate, a drain, a source, and a substrate, the source and the substrate of the first output buffer transistor connected to the drain of the pull-up transistor;

a second output buffer transistor having a gate, a drain, a source, and a substrate, the source and the substrate of the second output buffer transistor connected to the drain of the push-down transistor;

the drain of the first output buffer transistor and the drain of the second output buffer transistor coupled at a driver output node for transmitting a drive voltage signal thereto;

a first level shift driver having a gate, a drain, a source, and a substrate, the source and the substrate of the first level shift driver connected to the high voltage input node, the gate of the first level shift driver connected to the drain of the pull-up transistor;

a second level shift driver having a gate, a drain, a source, and a substrate, the source and substrate of the second level shift driver connected to the low voltage input node;

a swing-limiting buffer device having a gate, a drain, a source, and a substrate, the source and the substrate of the swing-limiting buffer device and the drain of the first level shift driver coupled to the gate of the pull-up transistor for transmitting a charging control voltage thereto;

a first input node connected to the gate of the swing-limiting buffer device for receiving a first adjustable voltage;

a buffer transistor having a gate, a drain, a source, and a substrate, the drain of the buffer transistor connected to the drain of the swing-limiting buffer device, the source and the substrate of the buffer transistor connected to the drain of the second level shift driver;

a second input node for receiving a second adjustable voltage;

a first high voltage transistor having a gate, a drain, a source, and a substrate, the source and the substrate of the first high voltage transistor connected to the second input node;

a second high voltage transistor having a gate, a drain, a source, and a substrate, the source and the substrate of the second high voltage transistor connected to the second input node;

a third input node for receiving an input drive voltage signal;

a first interface transistor having a gate, a drain, a source, and a substrate, the source and the substrate of the first interface transistor connected to the low voltage input node, the gate of the first interface transistor connected to the third input node;

the drain of the first interface transistor, the gate of the second high voltage transistor, and the drain of the first high voltage transistor connected to the gate of the second level shift driver;

a second interface transistor having a gate, a drain, a source, and a substrate, the source and the substrate of the second interface transistor connected to the low voltage input node;

the drain of the second interface transistor, the drain of the second high voltage transistor, and the gate of the first high voltage transistor connected to the gate of the push-down transistor for transmitting a discharging control voltage thereto;

an inverter having an input and an output, the input of the inverter connected to the third input node, the output of the inverter connected to the gate of the second interface transistor; and a fourth input node for receiving an intermediate voltage, the gate of the first output buffer transistor, the gate of the second output buffer transistor, and the gate of the buffer transistor coupled to the fourth input node.

9. A capacitive display apparatus comprising:

a capacitive display device having a bandwidth and a display input node; and means connected to the display input node of the capacitive display device for feeding to the display input node of the capacitive display device a drive voltage signal having a bandwidth substantially within the bandwidth of the capacitive display device.

10. A capacitive display apparatus comprising:

a capacitive display device having a bandwidth and a display input node; and means connected to the display input node of the capacitive display device for driving the capacitive display device with a drive voltage signal having a bandwidth substantially within the bandwidth of the capacitive display device.

11. A capacitive display apparatus comprising:

a capacitive display device having a display input node for receiving a drive voltage signal;

charging means connected to the display input node of the capacitive display device for charging the capacitive display device;

discharging means connected to the display input node of the capacitive display device for discharging the capacitive display device;

discharge activation means responsive to a first voltage of an input drive voltage signal and connected to the discharging means for activating the discharging means to realize a predetermined discharging current from the capacitive display device, the predetermined discharging current providing a first drive voltage response of the drive voltage signal, the first drive voltage response having a bandwidth substantially within the bandwidth of the capacitive display device; and charge activation means responsive to a second voltage of the input drive voltage signal and connected to the charging means for activating the charging means to realize a predetermined charging current to the capacitive display device, the predetermined charging current providing a second drive voltage response of the drive voltage signal, the second drive voltage response having a bandwidth substantially within the bandwidth of the capacitive display device.

12. A capacitive display apparatus comprising:

a capacitive display device having a display input node for receiving a drive voltage signal;

a high voltage input node for receiving a first voltage;

a low voltage input node for receiving a second voltage;

a pull-up transistor having a gate, a source, and a drain, the source of the pull-up transistor connected to the high voltage input node;

a push-down transistor having a gate, a source, and a drain, the drain of the push-down transistor connected to the drain of the pull-up transistor, the source of the push-down transistor connected to the low voltage input node;

the drain of the pull-up transistor and the drain of the push-down transistor connected to the display input node for providing the drive voltage signal;

a pull-up voltage level shifter having a first input node for receiving an input drive voltage signal, a second input node for receiving a first adjustable voltage and an output node connected to the gate of the pull-up transistor for transmitting a charging control voltage thereto; and a push-down voltage level shifter having a first input node for receiving the input drive voltage signal, a second input node for receiving a second adjustable voltage and an output node connected to the gate of the push-down transistor for transmitting a discharging control voltage thereto;

whereby the pull-up voltage level shifter provides a charging control voltage at the gate of the pull-up transistor within a range defined by the first voltage and the first adjustable voltage, and the push-down voltage level shifter provides a discharging control voltage at the gate of the push-down transistor within a range defined by the second adjustable voltage and the second voltage.

13. The capacitive display apparatus claimed in claim 12, wherein the pull-up voltage level shifter comprises:

a first high voltage transistor having a gate, a drain, a source, and a substrate, the source and the substrate of the first high voltage transistor connected to the high voltage input node;

a second high voltage transistor having a gate, a drain, a source, and a substrate, the source and the substrate of the second high voltage transistor connected to the high voltage input node, the gate of the second high voltage transistor connected to the drain of the first high voltage transistor;

a voltage limiting transistor having a gate, a drain, a source, and a substrate, the source of the voltage limiting transistor connected to the drain of the second high voltage transistor, the substrate of the voltage limiting transistor connected to the high voltage input node, the drain of the voltage limiting transistor connected to the gate of the first high voltage transistor, the gate of the voltage limiting transistor connected to the second input node of the pull-up voltage level shifter;

a first interface transistor having a gate, a drain, a source, and a substrate, the drain of the first interface transistor connected to the drain of the first high voltage transistor, the source and the substrate of the first interface transistor connected to the low voltage input node, the gate of the first interface transistor connected to the first input node of the pull-up voltage level shifter;

a second interface transistor having a gate, a drain, a source, and a substrate, the drain of the second interface transistor connected to the drain of the voltage limiting transistor, the source and the substrate of the second interface transistor connected to the low voltage input node; and an inverter having an input and an output, the input of the inverter connected to the first input node of the pull-up voltage level shifter, the output of the inverter connected to the gate of the second interface transistor.

14. The capacitive display apparatus claimed in claim 12, wherein the push-down voltage level shifter comprises:

a first high voltage transistor having a gate, a drain, a source, and a substrate, the source and the substrate of the first high voltage transistor connected to the second input node of the push-down voltage level shifter;

a second high voltage transistor having a gate, a drain, a source, and a substrate, the source and the substrate of the second high voltage transistor connected to the second input node of the push-down voltage level shifter, the gate of the second high voltage transistor connected to the drain of the first high voltage transistor;

a first interface transistor having a gate, a drain, a source, and a substrate, the drain of the first interface transistor connected to the drain of the first high voltage transistor, the source and the substrate of the first interface transistor connected to the low voltage source, the gate of the first interface transistor connected to the first input node of the push-down voltage level shifter;

a second interface transistor having a gate, a drain, a source, and a substrate, the drain of the second interface transistor coupled to the drain of the second high voltage transistor and the gate of the first high voltage transistor at the output node of the push-down voltage level shifter, the source and the substrate of the second interface transistor connected to the low voltage input node; and an inverter having an input and an output, the input of the inverter connected to the first input node of the push-down voltage level shifter, the output of the inverter connected to the gate of the second interface transistor.

15. A capacitive display apparatus comprising:

a capacitive display device having a display input node for receiving a drive voltage signal;

a high voltage input node for receiving a first voltage;

a low voltage input node for receiving a second voltage;

a pull-up transistor having a gate, a drain, a source, and a substrate, the source and the substrate of the pull-up transistor connected to the high voltage input node;

a push-down transistor having a gate, a drain, a source, and a substrate, the source and the substrate of the push-down transistor connected to the low voltage input node;

a first output buffer transistor having a gate, a drain, a source, and a substrate, the source and the substrate of the first output buffer transistor connected to the drain of the pull-up transistor;

a second output buffer transistor having a gate, a drain, a source, and a substrate, the source and the substrate of the second output buffer transistor connected to the drain of the push-down transistor;

the drain of the first output buffer transistor and the drain of the second output buffer transistor coupled at a driver output node for transmitting the drive voltage signal thereto, the driver output node connected to the display input node;

a first level shift driver having a gate, a drain, a source, and a substrate, the source and the substrate of the first level shift driver connected to the high voltage input node, the gate of the first level shift driver connected to the drain of the pull-up transistor;

a second level shift driver having a gate, a drain, a source, and a substrate, the source and substrate of the second level shift driver connected to the low voltage input node;

a swing-limiting buffer device having a gate, a drain, a source, and a substrate, the source and the substrate of the swing-limiting buffer device and the drain of the first level shift driver coupled to the gate of the pull-up transistor for transmitting a charging control voltage thereto;

a first input node connected to the gate of the swing-limiting buffer device for receiving a first adjustable voltage;

a buffer transistor having a gate, a drain, a source, and a substrate, the drain of the buffer transistor connected to the drain of the swing-limiting buffer device, the source and the substrate of the buffer transistor connected to the drain of the second level shift driver;

a second input node for receiving a second adjustable voltage;

a first high voltage transistor having a gate, a drain, a source, and a substrate, the source and the substrate of the first high voltage transistor connected to the second input node;

a second high voltage transistor having a gate, a drain, a source, and a substrate, the source and the substrate of the second high voltage transistor connected to the second input node;

a third input node for receiving an input drive voltage signal;

a first interface transistor having a gate, a drain, a source, and a substrate, the source and the substrate of the first interface transistor connected to the low voltage input node, the gate of the first interface transistor connected to the third input node;

the drain of the first interface transistor, the gate of the second high voltage transistor, and the drain of the first high voltage transistor connected to the gate of the second level shift driver;

a second interface transistor having a gate, a drain, a source, and a substrate, the source and the substrate of the second interface transistor connected to the low voltage input node;

the drain of the second interface transistor, the drain of the second high voltage transistor, and the gate of the first high voltage transistor connected to the gate of the push-down transistor for transmitting a discharging control voltage thereto;

an inverter having an input and an output, the input of the inverter connected to the third input node, the output of the inverter connected to the gate of the second interface transistor; and a fourth input node for receiving an intermediate voltage, the gate of the first output buffer transistor, the gate of the second output buffer transistor, and the gate of the buffer transistor coupled to the fourth input node.

* * * * *